United States Patent [19]

Serikawa et al.

[11] Patent Number: 5,123,050
[45] Date of Patent: Jun. 16, 1992

[54] SOUND FIELD CONTROL SYSTEM

[75] Inventors: Mitsuhiko Serikawa, Hirakata; Masaharu Matsumoto, Katano; Akihisa Kawamura, Hirakata; Katsuaki Sato, Osaka, all of Japan

[73] Assignee: Matsushita Electric Industrial Co., Ltd., Osaka, Japan

[21] Appl. No.: 596,086

[22] Filed: Oct. 11, 1990

[30] Foreign Application Priority Data

Oct. 12, 1989 [JP] Japan .................. 1-266907

[51] Int. Cl.⁵ .................. H03G 3/00
[52] U.S. Cl. .................. 381/61; 381/63
[58] Field of Search .......... 381/61, 62, 63; 84/603, 84/630, 626, DIG. 26

[56] References Cited

U.S. PATENT DOCUMENTS

| | | | |
|---|---|---|---|
| 4,569,268 | 2/1986 | Futamase et al. | 381/62 |
| 4,628,789 | 12/1986 | Fujimori | 381/63 |
| 4,701,956 | 10/1987 | Katoh | 381/61 |
| 4,942,799 | 7/1990 | Suzuki | 84/603 |

FOREIGN PATENT DOCUMENTS 61-257099 11/1986 Japan .

Primary Examiner—Forester W. Isen
Assistant Examiner—Sylvia Chen
Attorney, Agent, or Firm—Wenderoth, Lind & Ponack

[57] ABSTRACT

In the process of forming the effect sound for reproducing a sound field, a down-sampling part for reducing the sampling frequency of the digital signal is disposed before the step of the digital operation which becomes the central part of the forming process, by which a large amount of operation processing is carried out at a low sampling rate. With respect to the direct sound, processing such as gain adjustment is carried out without decreasing the sampling frequency. This results in a sound field control system which permits one to realize a higher quality and natural sound field control effect without significantly increasing the amount of hardware needed.

2 Claims, 3 Drawing Sheets

SOUND FIELD CONTROL SYSTEM

BACKGROUND OF THE INVENTION

1. Field of the Invention

The present invention relates to a sound field control system which produces in a relatively small listening room, a widely and deeply spreading sound field in which a listener feels as if the listener is in a concert hall.

2. Description of the Prior Art

There has so far been realized a sound field control technique which permits the listeners to perceive a space like a hall or a well-designed listening room in a small space by convolving suitable initial reflection sounds in an audio signal (e.g., Sec Japanese Laid-open Patent Publication No. 61-257099/1986).

In the conventional sound field control systems, the number of taps, i.e., the number of reflection sounds, that can be realized is restricted, in view of the limited processing capacity of the hardware and the limited sampling cycle in convolution-calculation of the initial reflection sounds on the audio signal in order to realize for example a feeling of a hall. Furthermore, in adding reverberation sound in order to realize an atmosphere of a church, the amount of possible calculations for forming the reverberation sound is limited for the same reasons as mentioned above, providing insufficient effect.

These effect sounds, such as reflection sound, reverberation sound, etc. show attenuation in their high pass components in comparison with direct sound. Especially, with respect to the components higher than 10 KHz, even if they are cut, the sound is unaffected with respect to the sound field control effect.

Accordingly, a system of operation processing both the direct sound and these effect sounds uniformly with the sampling frequency higher than 40 KHz has a limited cost effectiveness.

SUMMARY OF THE INVENTION

An object of the present invention is to realize a higher quality and natural sound field control effect without significantly increasing the hardware scale.

In order to attain the above object, a sound field control system of the present invention comprises a down-sampling means for sampling an input digital audio signal having a normal sampling frequency at a lower sampling frequency than the normal sampling frequency to obtain a down-sampled audio signal, an operation means for producing an effect sound signal from the down-sampled audio signal, an up-sampling means for sampling the effect sound signal at the normal sampling frequency, and addition means for adding the input digital audio signal and an output signal of the up-sampling means.

According to the present invention, by the above-mentioned constitution, with respect to the direct sound, processing such as gain adjustment is carried out at the normal sampling frequency without lowering the sampling frequency, i.e. without exerting band limitation, and on the other hand, with respect to the effect sound, because the operation time for producing the effect sound increase to a large extent by reducing the sampling frequency. In case of adding the reflective sounds, the number of the reflection sounds to be convolved can be increased to a large extent, and in case of adding the reverberation sounds, it becomes possible to increase, for example, the number of steps of the Schroeder type all-pass filter. So, it is possible to realize a higher quality and natural sound field control effect without increasing the amount of hardware of the sound field control system.

DESCRIPTION OF THE PREFERRED EMBODIMENTS

Figure 1:
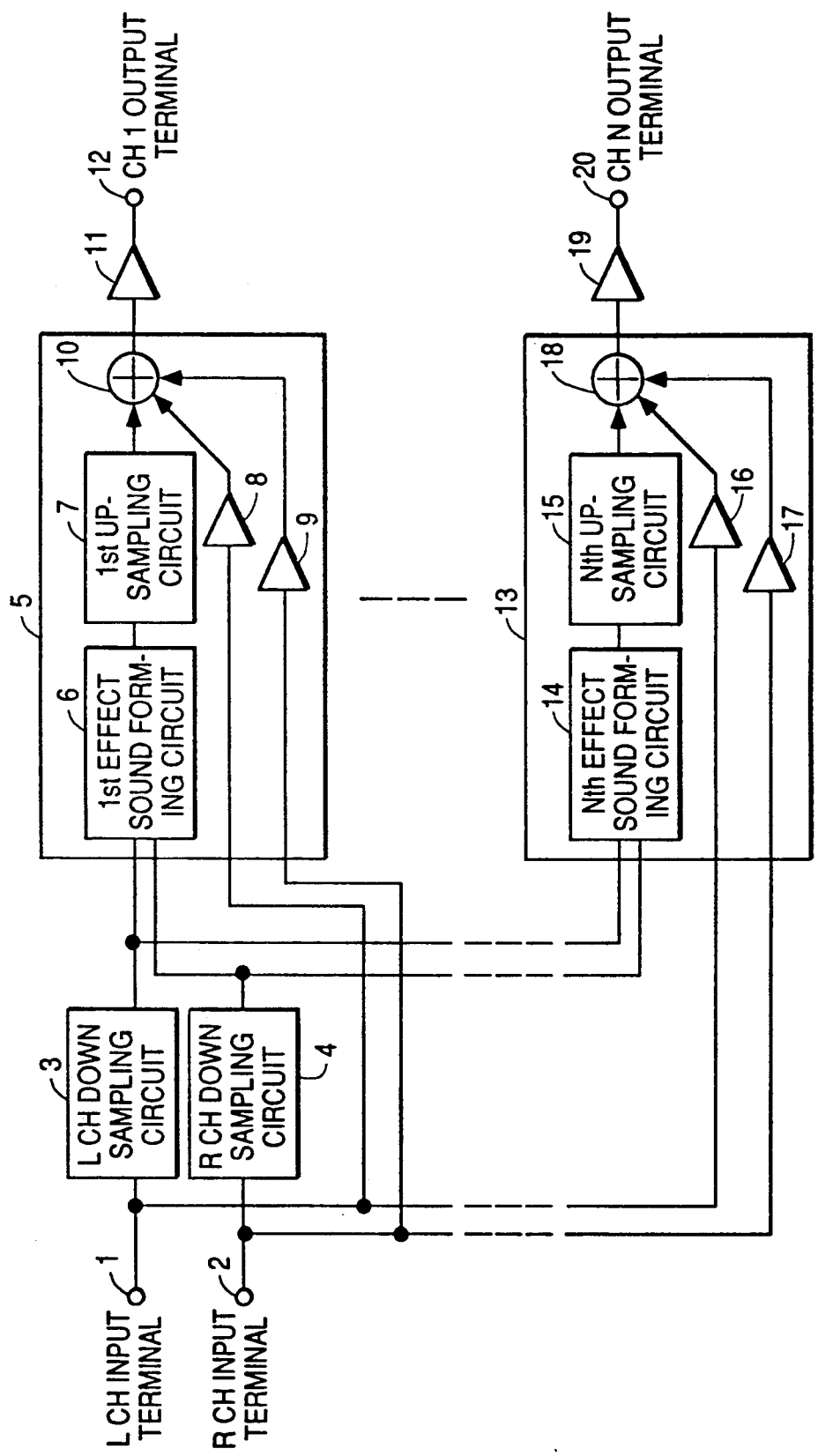
FIG. 1 shows a signal processing block diagram of a sound field control system in accordance with a first embodiment of the present invention.
Figure 2:
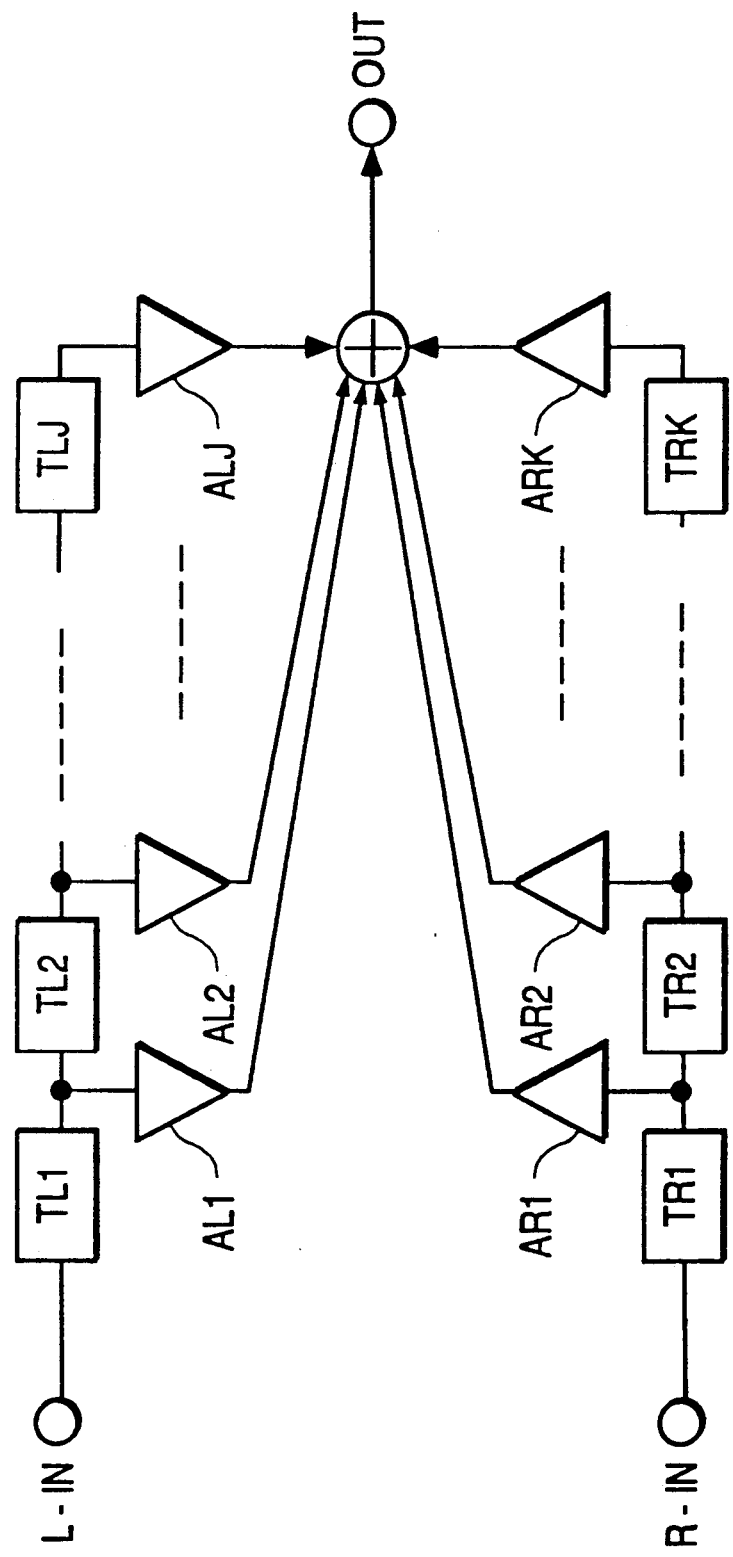
FIG. 2 shows a construction of an FIR type filter for convolution processing in an embodiment of the effect sound forming means.
Figure 3:
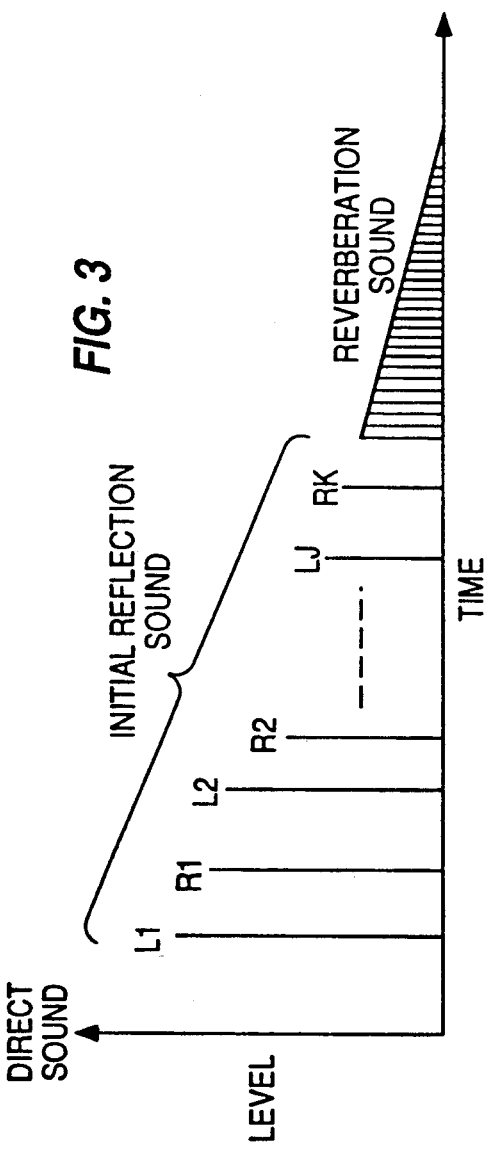
FIG. 3 shows a schematic view of the impulse response of the sound field control system of the present invention.

FIG. 1 shows a signal processing block diagram of a sound field control system in accordance with a first embodiment of the present invention; FIG. 2 shows a construction of an FIR type filter for convolution processing in an embodiment of the effect sound forming means; and FIG. 3 shows a schematic view of the impulse response of the sound field control system of the present invention.

In FIG. 1, elements 1 and 2 are respectively a left channel (L ch) input terminal and right channel (R ch) input terminal; element 3 and 4 are respectively an L ch down-sampling circuit and an R ch down-sampling circuit for reducing the sampling frequency by decimating input digital audio signal data having a normal sampling frequency after low-pass filtering an L ch input signal and an R ch input signal, respectively. Element 5 is a signal processing block for the channel 1 (ch 1), being constituted by elements 6 to 10 which are to be described hereafter. That is to say, element 6 is a first effect sound forming circuit which provides appropriate signal processing to the signals outputted from the L ch down-sampling circuit 3 and R ch down-sampling circuit 4 to form an effect sound. Element 7 is a first up-sampling circuit which inserts a zero data in the signal outputted from the first effect sound forming circuit 6 to return the sampling frequency to the normal sampling frequency, and then carries out low-pass filtering to smooth the signal. Elements 8 and 9 are respectively a level adjusting circuit for the first L ch direct sound and a level adjusting circuit for the first R ch direct sound. Element 10 is a first addition circuit for adding the output signals from the first up-sampling circuit 7, the first adjusting circuit 8 for the L ch direct sound and the level adjusting circuit 9 for the R ch direct sound. Element 11 is a level adjusting circuit for ch 1 for adjusting the level of the output signal from the first addition circuit 10, and element 12 is a ch 1 output terminal. Next, element 13 is a signal processing block for the channel N (ch N); element 14 is an Nth effect sound forming circuit; element 15 is an Nth up-sampling circuit; element 16 is a level adjusting circuit for the Nth L ch direct sound; element 17 is a level adjusting circuit for the Nth R ch direct sound; element 18 is an Nth addition circuit; element 19 is a level adjusting part for the ch N, and element 20 is a ch N output terminal. The functions of these elements are the same as those of the constituting elements 5 to 12 as previously explained.

With respect to the sound field control system constituted as above, the operation thereof is explained below the reference to FIGS. 1, 2 and 3.

The L ch and R ch digital audio signals having the normal sampling frequency inputted from the L ch input terminal 1 and R ch input terminal 2 are subjected to low-pass filtration by the L ch down-sampling circuit 3 and R ch down-sampling circuit 4, respectively, where the sampling frequency is dropped by decimation of the signal data. The down-sampled data are sent to the signal processing block for the respective channels 1 to N. In FIG. 1, a block diagram is drawn on assumption that in general there are N output channels, but as a representative description is given on the processing in the signal processing block 5 for ch 1. The signal after dropping the sampling frequency is sent to the first effect sound forming circuit 6, where it is subjected to various operation processings for forming the effect sound such as reflection sound or reverberation sound.

In FIG. 2, there is shown an example of a constitution of an FIR type filter for convolving the initial reflection sound in a hall or the like into an audio signal. In FIG. 2, the L ch signal is convolved with reflection sounds of amplitudes AL 1 − AL J and delay times TL 1 − TL J. The R ch signal is convolved with reflection sounds of amplitudes AR 1 − AR K and delay times TR 1 − TR K corresponding thereto. Because the abovementioned operations are carried out at the reduced sampling rate, the operation amount can be greatly increased in comparison with the case of not performing down-sampling, and accordingly a greater number of reflection sounds can be convolved. In FIG. 3, the reflection sounds formed in the above manner, i.e., the inpulse response of the sound field control system, is shown as the "initial reflection sound".

The effect sound signal formed in the first effect sound forming circuit 6 is subjected to insertion of zero data between samples in the first up-sampling circuit 7 to recover to the normal sampling frequency signal, and is subjected to low-pass filtration for smoothing. On the other hand, the L ch and R ch signals inputted from the L ch input terminal 1 and R ch input terminal 2 are fed as is to the signal processing block 5 for ch 1, and subjected to gain adjustment in the level adjusting circuit 8 for l ch direct sound and the level adjusting circuit 9 for r ch direct sound. Thereafter, they are added to the effect sound formed as noted above in the addition circuit 10, and outputted as the direct sound plus effect sound from the signal processing block 5 for ch 1. And, after being subjected to level adjustment in the level adjusting circuit 11 for ch 1, they are outputted from the ch 1 output terminal 12.

As described above, according to this embodiment, by subjecting the sound to operation processing by dropping the sampling frequency in the effect sound forming process, the operation amount can be greatly increased without increasing the amount of hardware needed, and a quality improvement of the effect sound can be expected through the increase in the number of the reflection sounds to be convolved.

In this embodiment, a constitution of an FIR type filter for convolution processing of reflection sound has been shown in FIG. 2 in an embodiment of the first effect sound forming circuit 6, but it is not necessarily limited to the convolution of reflection sound but may be, for example, a processing means for formation of reverberation sound as shown incidentally in FIG. 3.

Hereinafter, the second embodiment of the present invention is explained with reference to the drawing.

Figure 4:
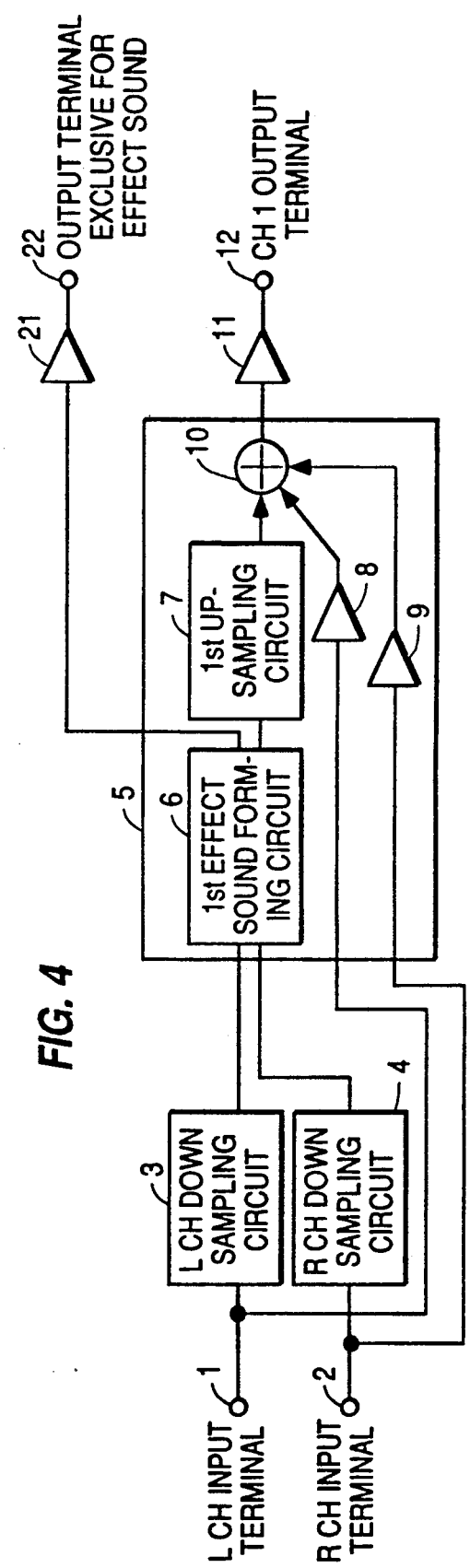
FIG. 4 shows a signal processing block diagram of a sound field control system in accordance with a second embodiment of the present invention.

FIG. 4 shows a signal processing block diagram of the sound field control system in accordance with the second embodiment of the present invention.

In FIG. 4, the constitution elements from 1 to 12 are the same as those in FIG. 1. Element 21 is a level adjusting circuit to be used exclusively for the effect sound, and 22 is an output terminal to be used exclusively for the effect sound. In this embodiment, the point of the difference from the constitution of FIG. 1 is that the signal outputted from the first effect sound forming circuit 6 is subjected to level adjustment in the level adjusting circuit 21 to be used exclusively for the effect sound without passing through the first up-sampling circuit 7, after which it is directly outputted from the output terminal 22 to be used exclusively for the effect sound as an exclusive signal for the effect sound, without reinstating the sampling frequency. By adopting such a constitution, with respect to the signals of the channel for outputting the effect sound only with a speaker positioned on the side or the rear part, zero value insertion for up-sampling or low-pass filtration processing for smoothing can be saved, and by proportionally increasing the operation amount for formation of the effect sound, it becomes possible to expect a quality improvement of the effect sound.

What is claimed is:

1. A sound field control system comprising:
   a down-sampling means for dropping a sampling frequency of an input digital audio signal from a normal sampling frequency to a lower sampling frequency than the normal sampling frequency;
   an operation processing means for subjecting a signal outputted from the down-sampling means to digital operation processing to produce an effect sound signal;
   an up-sampling means for returning the sampling frequency of the effect sound signal outputted from the operation processing means to the normal sampling frequency; and
   an addition means for adding the input digital audio signal and an output signal from the up-sampling means.

2. A sound field control system according to claim 1, further comprising a first output terminal coupled to an output of the addition means, and a second output terminal coupled to an output of the operation processing means.

* * * * *